(12) United States Patent
Jang et al.

(10) Patent No.: US 6,362,093 B1
(45) Date of Patent: Mar. 26, 2002

(54) DUAL DAMASCENE METHOD EMPLOYING SACRIFICIAL VIA FILL LAYER

(75) Inventors: Syun-Ming Jang; Anthony Yen; Hung-Chang Hsieh, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/378,459

(22) Filed: Aug. 20, 1999

(51) Int. Cl.[7] .......................................... H01L 21/4763
(52) U.S. Cl. ....................................... 438/633; 438/738
(58) Field of Search ................................ 438/627, 633, 438/638, 735, 737, 738, 691

(56) References Cited

U.S. PATENT DOCUMENTS

| | | | |
|---|---|---|---|
| 5,529,953 A | 6/1996 | Shoda | 437/189 |
| 5,741,626 A | 4/1998 | Jain et al. | 430/314 |
| 5,801,094 A | 9/1998 | Yew et al. | 438/624 |
| 5,801,099 A | 9/1998 | Kim et al. | 438/666 |
| 5,989,997 A | * 11/1999 | Lin et al. | 438/622 |
| 6,017,826 A | * 1/2000 | Zhou et al. | 438/720 |

OTHER PUBLICATIONS

Richard C. Jaeger. Introduction to Microelectronic Fabrication, vol. V. Addison–Wesley Publishing Co., May, 1993. pp. 8, 13–26.*

* cited by examiner

Primary Examiner—Olik Chaudhuri
Assistant Examiner—Ginette Peralta (74) *Attorney, Agent, or Firm*—George O. Saile; Stephen B. Ackerman; Stephen G. Stanton (57) ABSTRACT

A method for forming through a microelectronic layer a via contiguous with a trench. There is first provided a substrate. There is then formed over the substrate a first microelectronic layer. There is then formed upon the first microelectronic layer an etch stop layer. There is then formed upon the etch stop layer a second microelectronic layer. There is then formed over the second microelectronic layer a first patterned photoresist layer which defines the location of a via to be formed through the second microelectronic layer, the etch stop layer and the first microelectronic layer. There is then etched, while employing a first etch method which employs the first patterned photoresist layer as a first etch mask layer, the second microelectronic layer, the etch stop layer and the first microelectronic layer to form a corresponding patterned second microelectronic layer, patterned etch stop layer and patterned first microelectronic layer which define the via. There is then formed into at least a lower portion of the via a sacrificial via fill layer. There is then formed over the patterned second microelectronic layer a patterned second photoresist layer which defines the location of a trench to be formed through the patterned second microelectronic layer, where a first areal dimension of the via is smaller than and contained within a second areal dimension of the trench. There is then etched, while employing a second etch method which employs the second patterned photoresist layer as a second etch mask layer, the patterned second microelectronic layer to form a twice patterned second microelectronic layer which defines the trench, while not completely etching the sacrificial via fill layer within the via to form a no greater than partially etched sacrificial via fill layer within the via. Finally, there is then stripped the no greater than partially etched sacrificial via fill layer from the via to form the reduced height via contiguous with the trench.

38 Claims, 4 Drawing Sheets

DUAL DAMASCENE METHOD EMPLOYING SACRIFICIAL VIA FILL LAYER

BACKGROUND OF THE INVENTION

1. Field of the Invention

The present invention relates generally to methods for forming patterned layers within microelectronic fabrications. More particularly, the present invention relates to dual damascene methods for forming patterned layers within microelectronics fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased, and microelectronic device and patterned microelectronic conductor layers dimensions have decreased, it has become increasingly common within the art of microelectronic fabrication to employ dual damascene methods for forming contiguous patterned conductor stud layer/patterned conductor interconnect layer layers within microelectronic fabrications. Such dual damascene methods are understood by a person skilled in the art to entail forming through a lower portion of a dielectric layer a via which accesses a contact region within a microelectronic layer formed beneath the dielectric layer, while also forming through an upper portion of the dielectric layer a trench which is contiguous with and larger than the via formed through the lower portion of the dielectric layer, prior to forming within the via and the contiguous trench a contiguous patterned conductor stud layer/patterned conductor interconnect layer while employing a single conductor material and while employing a single chemical mechanical polish (CMP) planarizing when forming the contiguous patterned conductor stud layer/patterned conductor interconnect layer.

Such dual damascene methods are desirable within the art of microelectronic fabrication, at least in part, since such dual damascene methods provide for microelectronic fabrication process efficiency when fabricating patterned conductor stud layers and patterned conductor interconnect layers within microelectronic fabrications.

While dual damascene methods are thus desirable within the art of microelectronic fabrication, dual damascene methods are nonetheless not entirely without problems in the art of microelectronic fabrication. In particular, it is often difficult to form within microelectronic fabrications patterned microelectronic dielectric layers which define contiguous vias and trenches into which are subsequently formed contiguous patterned conductor stud layer/patterned conductor interconnect layer layers, while defining the contiguous vias and trenches, and thus the contiguous patterned conductor stud layer/patterned conductor interconnect layer layers, with uniform and enhanced dimensional integrity.

It is thus towards the goal of providing within microelectronic fabrications dual damascene methods through which may be formed contiguous patterned conductor stud layer/patterned conductor interconnect layer layers with enhanced dimensional integrity that the present invention is directed.

Various dual damascene methods possessing desirable properties have been disclosed in the art of microelectronic fabrication.

For example, Shoda, in U.S. Pat. No. 5,529,953, discloses a dual damascene method for forming through a dielectric layer within a microelectronic fabrication a contiguous patterned conductor stud layer/patterned conductor interconnect layer with inhibited formation of seams and voids within the contiguous patterned conductor stud layer/patterned conductor interconnect layer. The dual damascene method employs: (1) a first seed material formed upon the floor of a via formed through the dielectric layer, into which via is formed a patterned conductor stud layer portion of the contiguous patterned conductor stud layer/patterned conductor interconnect layer; and (2) a second seed material formed upon the floor of a trench formed within the dielectric layer, into which trench is formed a patterned conductor interconnect layer portion of the contiguous patterned conductor stud layer/patterned conductor interconnect layer, where a conductor material from which is formed the contiguous patterned conductor stud layer/patterned conductor interconnect layer is formed more rapidly upon the first seed material than upon the second seed material.

In addition, Jain et al., in U.S. Pat. No. 5,741,626, disclose a method which may be employed for forming a dual damascene structure with enhanced dimensional integrity within a microelectronic fabrication while employing i-line and g-line photoexposure radiation when fabricating the dual damascene structure within the microelectronic fabrication. The method employs when fabricating the dual damascene structure at least one anti-reflective coating (ARC) layer formed of a dielectric tantalum nitride material, where the anti-reflective coating (ARC) layer may be formed in any of several locations when forming the dual damascene structure.

Further, Yew et al., in U.S. Pat. No. 5,801,094, disclose a dual damascene method for forming through a composite dielectric layer within a microelectronic fabrication a contiguous patterned conductor stud layer/patterned conductor interconnect layer with greater process latitude when forming the contiguous patterned conductor stud layer/patterned conductor interconnect layer through the composite dielectric layer within the microelectronic fabrication. The dual damascene method employs a patterned etch stop layer formed interposed between: (1) a lower dielectric layer within the composite dielectric layer, through which lower dielectric layer is formed a via into which is formed a patterned conductor stud layer portion of the contiguous patterned conductor stud layer/patterned conductor interconnect layer; and (2) an upper dielectric layer within the composite dielectric layer, through which upper dielectric layer is formed a trench contiguous with the via, into which trench is formed a patterned conductor interconnect layer portion of the contiguous patterned conductor stud layer/patterned conductor interconnect layer, wherein the trench and the via are etched employing a single plasma etch method which provides a tapered edge to an etched patterned etch stop layer formed from the patterned etch stop layer.

Finally, Kim et al., in U.S. Pat. No. 5,801,099, disclose a dual damascene method for forming through a dielectric layer within a microelectronic fabrication a contiguous patterned conductor stud layer/patterned conductor interconnect layer with inhibited etch damage to a conductor contact region accessed by a patterned conductor stud layer portion of the contiguous patterned conductor stud layer/patterned conductor interconnect layer. The dual damascene method employs a sacrificial via fill layer which defines the location of a via formed through a lower portion of the dielectric layer, the via being contiguous with a trench formed through an upper portion of the dielectric layer, where the sacrificial via fill layer is formed prior to forming the dielectric layer.

Desirable in the art of microelectronic fabrication are additional dual damascene methods for forming through a dielectric layer within a microelectronic fabrications a via contiguous with a trench, where the via contiguous with the trench is formed with enhanced dimensional integrity such that a contiguous patterned conductor stud layer/patterned conductor interconnect layer formed into the via contiguous with the trench is similarly also formed with enhanced dimensional integrity.

It is towards the foregoing object that the present invention is directed.

SUMMARY OF THE INVENTION

A first object of the present invention is to provide a dual damascene method for forming within a microelectronic fabrication a contiguous patterned conductor stud layer/ patterned conductor interconnect layer.

A second object of the present invention is to provide a method in accord with the first object of the present invention, where the contiguous patterned conductor stud layer/patterned conductor interconnect layer is formed with enhanced dimensional integrity.

A third object of the present invention is to provide a method in accord with the first object of the present invention and the second object of the present invention, which method is readily commercially implemented.

In accord with the objects of the present invention, there is provided by the present invention a method for forming through a microelectronic layer a via contiguous with a trench. To practice the method of the present invention, there is first provided a substrate. There is then formed over the substrate a first microelectronic layer. There is then formed upon the first microelectronic layer an etch stop layer. There is then formed upon the etch stop layer a second microelectronic layer. There is then formed over the second microelectronic layer a first patterned mask layer which defines the location of a via to be formed through the second microelectronic layer, the etch stop layer and the first microelectronic layer. There is then etched, while employing a first etch method which employs the first patterned mask layer as a first etch mask layer, the second microelectronic layer, the etch stop layer and the first microelectronic layer to form a corresponding patterned second microelectronic layer, patterned etch stop layer and patterned first microelectronic layer which define the via. There is then formed into at least a lower portion of the via defined by the patterned second microelectronic layer, the patterned etch stop layer and the patterned first microelectronic layer a sacrificial via fill layer. There is then formed over the patterned second microelectronic layer a patterned second mask layer which defines the location of a trench to be formed through the patterned second microelectronic layer, where a first areal dimension of the via is smaller than and contained within a second areal dimension of the trench. There is then etched, while employing a second etch method which employs the second patterned mask layer as a second etch mask layer and the patterned etch stop layer as an etch stop layer, the patterned second microelectronic layer to form a twice patterned second microelectronic layer which defines the trench and a reduced height via, while not completely etching the sacrificial via fill layer within the reduced height via to form a no greater than partially etched sacrificial via fill layer within the reduced height via. Finally, there is then stripped the no greater than partially etched sacrificial via fill layer from the reduced height via to form the reduced height via contiguous with the trench.

Although the method of the present invention will typically and preferably be employed for forming through a dielectric layer within a microelectronic fabrication a via contiguous with a trench, the method of the present invention may in general be employed for forming through microelectronic layers including but not limited to microelectronic conductor layers, microelectronic semiconductor layers and microelectronic dielectric layers vias contiguous with trenches.

Similarly, although the method of the present invention will typically and preferably have filled within the via contiguous with the trench formed through the dielectric layer a contiguous patterned conductor stud layer/patterned conductor interconnect layer, the method of the present invention may similarly be employed to form within a via contiguous with a trench formed through a microelectronic layer a contiguous patterned microelectronic stud layer/ patterned microelectronic trench fill layer formed of a microelectronic material selected from the group consisting of microelectronic conductor materials, microelectronic semiconductor materials and microelectronic dielectric materials.

The present invention provides a dual damascene method for forming a contiguous patterned conductor stud layer/ patterned conductor interconnect layer within a microelectronic fabrication, where the contiguous patterned conductor stud layer/patterned conductor interconnect layer is formed with enhanced dimensional integrity. The present invention realizes the foregoing object by employing when forming within a dielectric layer a via contiguous with a trench into which via contiguous with the trench is formed the contiguous patterned conductor stud layer/patterned conductor interconnect layer a sacrificial via fill layer within the via through the dielectric layer when etching the contiguous trench within the dielectric layer.

The present invention is readily commercially implemented. The present invention employs methods and materials as are generally known in the art of microelectronic fabrication. Since it is a process sequencing and materials selection which provides at least in part the present invention, rather than the existence of methods and materials which provides the present invention, the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a dual damascene method for forming within a microelectronic fabrication a contiguous patterned conductor stud layer/patterned conductor interconnect layer, where the contiguous patterned conductor stud layer/patterned conductor interconnect layer is formed with enhanced dimensional integrity. The present invention realizes the foregoing object by employing when forming through a dielectric layer within a microelectronic fabrication a via contiguous with a trench into which via contiguous with the trench is formed the contiguous patterned conductor stud layer/patterned conductor interconnect layer, a sacrificial via fill layer within the via when etching the trench contiguous with the via.

The present invention may be employed for forming with enhanced dimensional integrity contiguous patterned conductor stud layer/patterned conductor interconnect layer layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although the preferred embodiments of the present invention illustrate the present invention within the context of forming through a composite dielectric layer while employing a dual damascene method a contiguous patterned conductor stud layer/patterned conductor interconnect layer within a corresponding via contiguous with a corresponding trench within the composite dielectric layer, it is understood by a person skilled in the art that the method of the present invention may be employed for forming within a microelectronic layer including but not limited to a microelectronic conductor layer, a microelectronic semiconductor layer or a microelectronic dielectric layer a via contiguous with a trench, with enhanced dimensional integrity. Similarly, the via contiguous with the trench formed through the microelectronic layer in accord with the present invention may have formed therein a contiguous patterned microelectronic stud layer/patterned microelectronic trench fill layer formed of a microelectronic material selected from the group consisting of microelectronic conductor materials, microelectronic semiconductor materials and microelectronic dielectric materials.

First Preferred Embodiment

Figure 1:
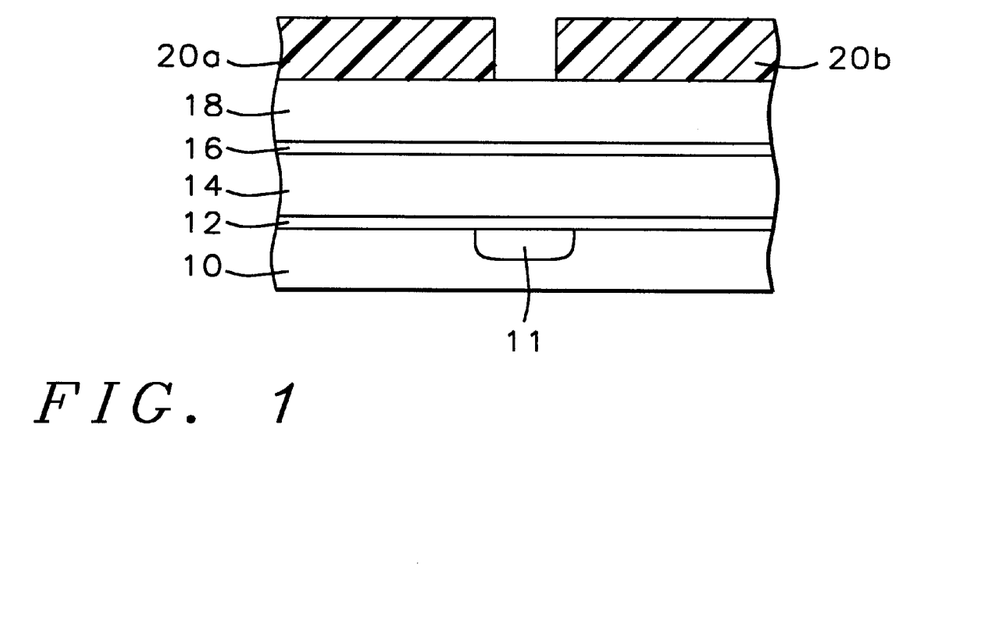
FIG. 1, FIG. 2, FIG. 3, FIG. 4 and FIG. 5 show a series of schematic cross-sectional diagrams illustrating the results of forming through a composite dielectric layer within a microelectronic fabrication in accord with a first preferred embodiment of the present invention a contiguous patterned conductor stud layer/patterned conductor interconnect layer within a corresponding via contiguous with a trench within the composite dielectric layer within the microelectronic fabrication.

Referring now to FIG. 1 to FIG. 5, there is shown a series of schematic cross-sectional diagrams illustrating the results of forming through a composite dielectric layer within a microelectronic fabrication in accord with a first preferred embodiment of the present invention a contiguous patterned conductor stud layer/patterned conductor interconnect layer within a corresponding via contiguous with a trench within the composite dielectric layer within the microelectronic fabrication. Shown in FIG. 1 is a schematic cross-sectional diagram of the microelectronic fabrication at an early stage in its fabrication in accord with the first preferred embodiment of the present invention.

Shown in FIG. 1, in a first instance, is a substrate 10 having formed therein a contact region 11.

Within the first preferred embodiment of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic fabrications.

Although not specifically illustrated within the schematic cross-sectional diagram of FIG. 1, the substrate 10 may be a substrate alone as employed within the microelectronic fabrication, or in the alternative, the substrate 10 may comprise the substrate as employed within the microelectronic fabrication, where the substrate has formed thereupon and/or thereover, and thus incorporated therein, any of several additional microelectronic layers as are conventional within the microelectronic fabrication within which is employed the substrate 10. Analogously with the substrate 10 itself, such additional microelectronic layers may be formed from any of several microelectronic materials selected from the group including but not limited to microelectronic conductor materials, microelectronic semiconductor materials and microelectronic dielectric materials.

Similarly, although also not specifically illustrated within the schematic cross-sectional diagram of FIG. 1, the substrate 10, particularly but not exclusively when the substrate 10 comprises a silicon semiconductor substrate employed within a semiconductor integrated circuit microelectronic fabrication, typically and preferably has formed therein and/or thereupon, and thus incorporated therein, microelectronic devices as are conventional within the microelectronic fabrication within which is employed the substrate 10. Such microelectronic devices may include, but are not limited to resistors, transistors, diodes and capacitors.

Within the first preferred embodiment of the present invention with respect to the contact region 11, the contact region 11 will typically and preferably be either a semiconductor contact region within a semiconductor layer incorporated within the substrate 10 or a conductor contact region within a conductor layer incorporated within the substrate 10. Typically and preferably, the contact region 11 will have a bidirectional linewidth within the substrate 10 of from about 0.2 to about 0.4 microns.

Within the first preferred embodiment of the present invention, more preferably, the substrate 10 comprises a silicon semiconductor substrate employed within a semiconductor integrated circuit microelectronic fabrication, and the contact region 11 is a copper containing conductor contact region within a patterned copper containing conductor layer formed over the silicon semiconductor substrate.

Shown also within FIG. 1 formed upon or over the substrate 10 is a series of four blanket layers comprising: (1) a blanket diffusion barrier layer 12 formed upon the substrate 10 and covering the contact region 11; (2) a blanket first dielectric layer 14 formed upon the blanket diffusion barrier layer 12; (3) a blanket etch stop layer 16 formed upon the blanket first dielectric layer 14; and (4) a blanket second dielectric layer 18 formed upon the blanket etch stop layer 16. Finally, there is also shown in FIG. 1 a pair of first patterned photoresist layers 20a and 20b formed upon the blanket second dielectric layer 18, where the pair of first patterned photoresist layers 20a and 20b serve in general as a pair of mask layers which define an aperture nominally centered above the contact region 11. Within the first preferred embodiment of the present invention, each of the foregoing four blanket layers and the additional pair of patterned photoresist layers may be formed employing methods and materials as are conventional in the art of microelectronic fabrication, although the additional pair of patterned photoresist layers may be formed of other appropriate masking materials.

For example, with respect to the blanket diffusion barrier layer 12, although the blanket diffusion barrier layer 12 is optional within the first preferred embodiment of the present invention, the blanket diffusion barrier layer 12 is typically generally incorporated within a microelectronic fabrication analogous or equivalent to the microelectronic fabrication whose schematic cross-sectional diagram is illustrated within FIG. 1 under circumstances where, in accord with the more preferred embodiment of the first preferred embodiment of the present invention, the contact region 11 is a copper containing conductor contact region which is susceptible to interdiffusion with various types of microelectronic dielectric materials, such as, in particular, silicon oxide microelectronic dielectric materials. Typically and preferably, under such circumstances, the blanket diffusion barrier layer 12 is formed of a silicon nitride dielectric material which may be formed employing methods including but not limited to chemical vapor deposition (CVD) methods, plasma enhanced chemical vapro deposition (PECVD) methods and physical vapor deposition (PVD) methods. Typically and preferably, the optional blanket diffusion barrier layer 12 is formed to a thickness of from about 200 to about 400 angstroms.

Within the first preferred embodiment of the present invention with respect to the blanket etch stop layer 16, for purposes of manufacturing efficiency, the blanket etch stop layer 16 is typically and preferably formed employing methods and materials analogous or equivalent to methods and materials employed for forming the blanket diffusion barrier layer 12. In addition, the blanket etch stop layer 16 is desirably formed of a dense dielectric material which is not susceptible to substantial etching within an etchant which is employed for etching the blanket second dielectric layer 18. Typically and preferably, the blanket etch stop layer 16 is formed to a thickness of from about 300 to about 600 angstroms from a dense dielectric material such as but not limited to a dense silicon nitride dielectric material or a dense silicon oxynitride dielectric material, although other materials may be employed for forming the blanket etch stop layer 16.

Within the preferred embodiment of the present invention with respect to both the blanket first dielectric layer 14 and the blanket second dielectric layer 18, both the blanket first dielectric layer 14 and the blanket second dielectric layer 18 are typically and preferably formed of a silicon oxide dielectric material, although other dielectric materials may be employed for forming either or both of the blanket first dielectric layer 14 and the blanket second dielectric layer 18, given the proviso that the materials from which are formed the blanket first dielectric layer 14 and the blanket second dielectric layer 18 are chosen in conjunction with the material from which is formed the blanket etch stop layer 16 such that the blanket etch stop layer 16 does in fact serve as an effective etch stop layer when etching the blanket second dielectric layer 18. Typically and preferably, the blanket first dielectric layer 14 is formed to a thickness of from about 5000 to about 7000 angstroms, while the blanket second dielectric layer 18 is also formed to a thickness of from about 5000 to about 7000 angstroms.

Finally, within the first preferred embodiment of the present invention with respect to the pair of first patterned photoresist layers 20a and 20b, the pair of first patterned photoresist layers 20a and 20b may be formed of photoresist materials as are conventional in the art of microelectronic fabrication, such photoresist materials being selected from the general groups of photoresist materials including but not limited to positive photoresist materials and negative photoresist materials. Within the first preferred embodiment of the present invention, the pair of first patterned photoresist layers 20a and 20b is preferably formed of a positive photoresist material formed to a thickness of about 5000 to about 8000 angstroms, to define as is illustrated within the schematic cross-sectional diagram of FIG. 1 an aperture of aperture width about 0.2 to about 0.4 microns leaving exposed a portion of the blanket second dielectric layer 18 nominally centered above the contact region 11.

Figure 2:
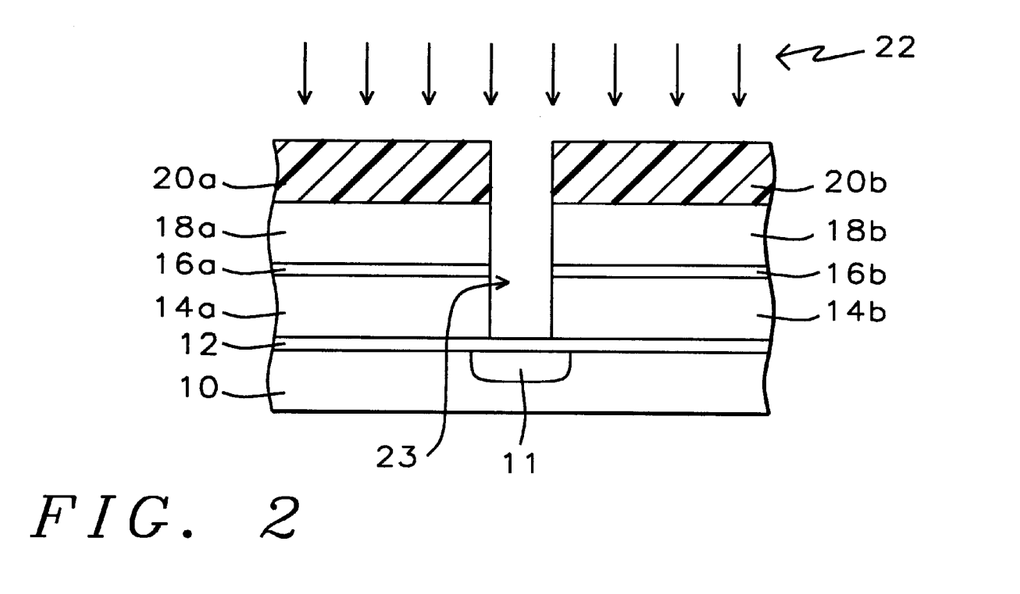

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there has been formed through the blanket second dielectric layer 18, the blanket etch stop layer 16 and the blanket first dielectric layer 14 a via 23, while employing the pair of patterned photoresist layers 20a and 20b as an etch mask layer in conjunction with a first etching plasma 22, where the via 23 is thus defined by a corresponding series of patterned second dielectric layers 18a and 18b, patterned etch stop layers 16a and 16b and patterned first dielectric layers 14a and 14b. Within the first preferred embodiment of the present invention, the first etching plasma 22 will typically and preferably employ an etchant gas composition dictated by the materials from which are formed the blanket second dielectric layer 18, the blanket etch stop layer 16 and the blanket first dielectric layer 14. Within the first preferred embodiment of the present invention where the blanket second dielectric layer 18 and the blanket first dielectric layer 14 are preferably formed of a silicon oxide dielectric material and the blanket etch stop layer 16 is preferably formed of a silicon nitride dielectric material or a silicon oxynitride dielectric material, the first etching plasma 22 will typically and preferably employ an etchant gas composition which upon plasma activation forms an active fluorine containing etchant species. Such an etchant gas composition may comprise, for example and without limitation, carbon tetrafluoride, trifluoromethane and argon.

When forming the via 23 defined by the pair of patterned second dielectric layers 18a and 18b, the patterned etch stop layers 16a and 16b and the pair of patterned first dielectric layers 14a and 14b upon an eight inch diameter substrate 10, the first etching plasma 22 also preferably employs: (1) a reactor chamber pressure of from about 100 to about 300 mtorr; (2) a radio frequency source power of from about 800 to about 1200 watts at a source radio frequency of 13.56 MHZ; (3) a bias power of from about 30 to about 70 watts; (4) a substrate 10 temperature of from about 20 to about 50 degrees centigrade; (5) a carbon tetrafluoride flow rate of from about 7 to about 13 standard cubic centimeters per minute (sccm); (6) a trifluoromethane flow rate of from about 40 to about 60 standard cubic centimeters per minute (sccm); and (7) an argon flow rate of from about 100 to about 140 standard cubic centimeters per minute (sccm).

Figure 3:
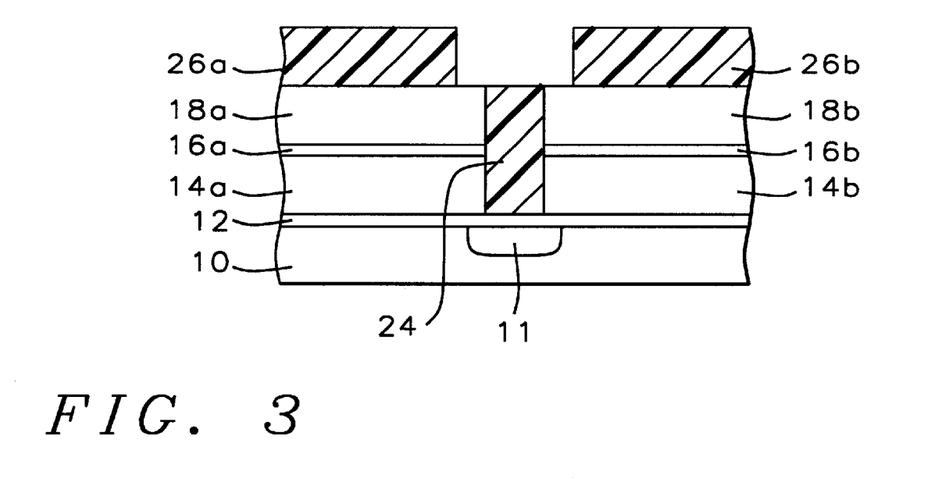

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, there has been stripped from the patterned second dielectric layers 18a and 18b the pair of first patterned photoresist layers 20a and 20b. The pair of first patterned photoresist layers 20a and 20b may be stripped from the pair of patterned second dielectric layers 18a and 18b to form in part the microelectronic fabrication whose schematic cross-sectional diagram is illustrated in FIG. 3 from the microelectronic fabrication whose schematic cross-sectional diagram is illustrated in FIG. 2 while employing photoresist stripping methods as are conventional in the art of microelectronic fabrication. Such photoresist stripping methods will typically and preferably include photoresist stripping methods selected from the group consisting of wet chemical photoresist stripping methods, dry oxygen containing plasma photoresist stripping methods, and aggregate methods thereof There is also shown within FIG. 3 formed into the via 23 a sacrificial via fill layer 24. Within the first preferred embodiment of the present invention, the sacrificial via fill layer 24 is formed employing methods and materials as are generally otherwise known in the art of microelectronic fabrication, to provide the sacrificial via fill layer 24 formed of a material which is preferably not exceedingly etched within an etching plasma which efficiently etches the patterned second dielectric layers 18a and 18b, but may nonetheless also readily be stripped from the microelectronic fabrication whose schematic cross-sectional diagram is illustrated within FIG. 3 while employing a stripping method which does not appreciably etch the patterned second dielectric layers 18a and 18b, the patterned etch stop layers 16a and 16b and the patterned first dielectric layers 14a and 14b.

While the present invention does not preclude that other materials may be found which fulfill the foregoing characteristics, it has been determined experimentally that spin-on-polymer (SOP) materials, including but not limited to polyimide organic polymer spin-on-polymer (SOP) materials and poly(arylene ether) organic polymer spin-on-polymer (SOP) materials (as well as derivatives thereof, such as fluorinated derivatives thereof) are particularly useful within the first preferred embodiment of the present invention, since plasma etch methods may be engineered to substantially etch silicon containing dielectric layers in the presence of organic polymer spin-on-polymer (SOP) layers, while organic polymer spin-on-polymer (SOP) dielectric layers may be stripped in the presence of silicon containing dielectric layers while not etching the silicon containing dielectric layers, while employing organic solvent stripping methods or oxygen containing plasma stripping methods.

As is illustrated within the schematic cross-sectional diagram of FIG. 3, the sacrificial via fill layer 24 preferably fills the via 23 while planarizing the via 23, although hypothetically, it is plausible within the present invention that the sacrificial via fill layer 24 either not completely fill the via 23 or alternatively overfill the via 23. To achieve the patterned planarized sacrificial via fill layer 24 as illustrated within the schematic cross-sectional diagram of FIG. 3 it is feasible, and under certain circumstances desirable, to employ a chemical mechanical polish (CMP) planarizing method, where for example and without limitation, when the sacrificial via fill layer 24 is formed of a poly(arylene ether) organic polymer spin-on-polymer (SOP) material it may be planarized while employing a zirconia (i.e., ZrO2) abrasive containing chemical mechanical polish (CMP) planarizing slurry composition.

Also shown within the schematic cross-sectional diagram of FIG. 3 is a pair of second patterned photoresist layers 26a and 26b (which serve as a pair of second mask layers and may thus alternatively be formed of other masking materials) formed upon the corresponding pair of patterned second dielectric layers 18a and 18b, where the pair of second patterned photoresist layers 26a and 26b defines a second aperture corresponding to a location of a trench desired to be formed through the patterned second dielectric layers 18a and 18b. Within the method of the present invention and the first preferred embodiment of the method of the present invention, an areal dimension of the via 23 is less than and contained within an areal dimension of the trench which corresponds to the second aperture defined by the pair of second patterned photoresist layers 26a and 26b. Thus, the pair of second patterned photoresist layers 26a and 26b defines the second aperture of minimum aperture width at least about 0.3 microns. The pair of second patterned photoresist layers 26a and 26b is otherwise formed employing methods, materials and thickness dimensions analogous or equivalent to the methods, materials and thickness dimensions employed for forming the pair of first patterned photoresist layers 20a and 20b as illustrated within the schematic cross-sectional diagrams of FIG. 1 and FIG. 2.

Figure 4:
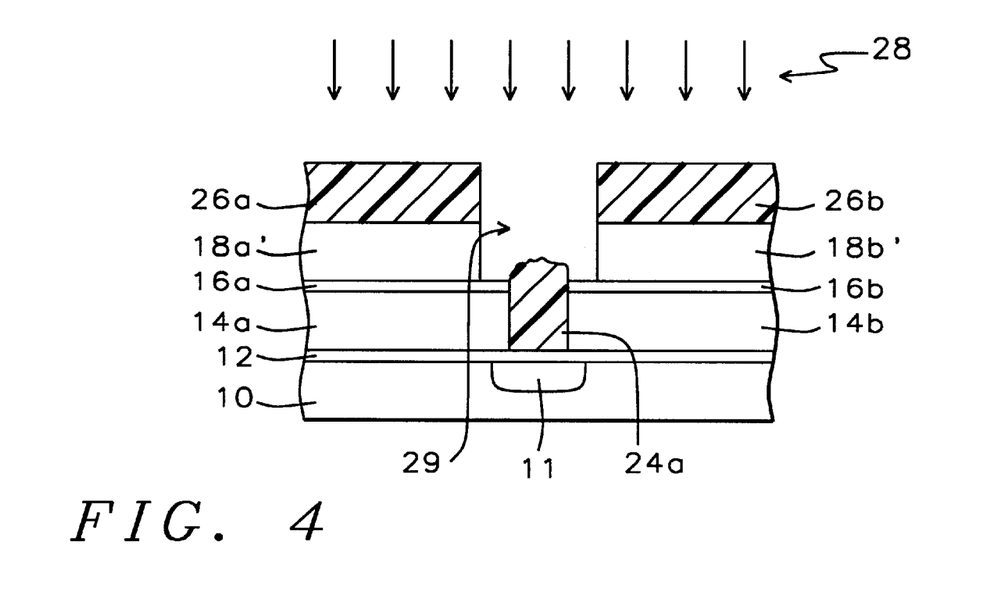

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the patterned second dielectric layers 18a and 18b have been additionally patterned to form a pair of twice patterned second dielectric layers 18a' and 18b', while employing the pair of second patterned photoresist layers 26a and 26b as an etch mask layer and the pair of patterned etch stop layers 16a and 16b as etch stop layers, in conjunction with a second etching plasma 28. The pair of twice patterned second dielectric layers 18a' and 18b' define, as discussed above, a trench 29 of greater areal dimension than the via 23, where the areal dimension of the via 23 is contained within the areal dimension of the trench 29. Similarly, upon etching the pair of patterned second dielectric layers 18a and 18b as illustrated within the schematic cross-sectional diagram of FIG. 3 to provide the pair of twice patterned second dielectric layers 18a' and 18b' as illustrated within the schematic cross-sectional diagram of FIG. 4, the via 23 is reduced in height to form a reduced height via.

As is illustrated within the schematic cross-sectional diagram of FIG. 4, incident to forming by etching with the second etching plasma 28 the twice patterned second dielectric layers 18a' and 18b' from the patterned second dielectric layers 18a and 18b, the sacrificial via fill layer 24 is partially etched to form the etched sacrificial via fill layer 24a. Preferably, as is also illustrated within the schematic cross-sectional diagram of FIG. 4, the sacrificial via fill layer 24 etches at a rate at least somewhat lower than the pair of second patterned dielectric layers 18a and 18b, thus leaving remaining the etched sacrificial via fill layer 24a which rises above the patterned etch stop layers 16a and 16b which define, in part, the reduced height via.

Within the first preferred embodiment of the present invention, the second etching plasma 28 preferably employs methods, materials and process parameters analogous or equivalent to the methods, materials and process parameters employed within the first etching plasma 22 as illustrated within the schematic cross-sectional diagram of FIG. 2.

Figure 5:
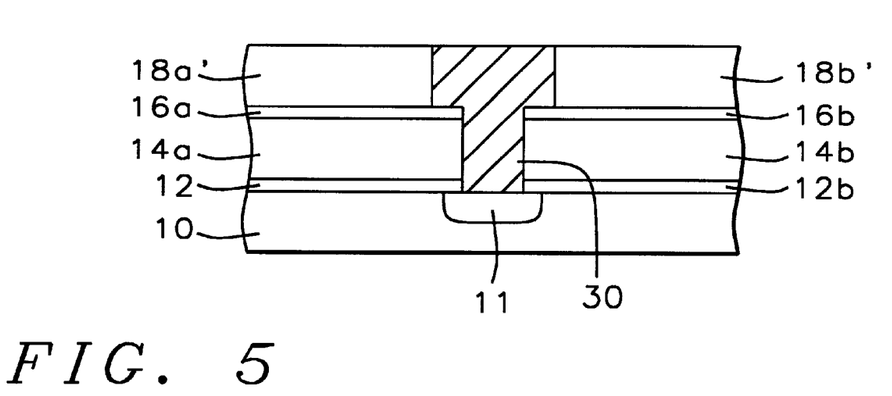

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein, in a first instance, the pair of second patterned photoresist layers 26a and 26b, and the etched sacrificial via fill layer 24a, have been stripped from the microelectronic fabrication. The pair of second patterned photoresist layers 26a and 26b, and the etched sacrificial via fill layer 24a, may be stripped from the microelectronic fabrication whose schematic cross-sectional diagram is illustrated in FIG. 4 to provide in part the microelectronic fabrication whose schematic cross-sectional diagram is illustrated in FIG. 5 while employing methods and materials as are conventional in the art of microelectronic fabrication. Such methods and materials will typically, but not exclusively, include wet chemical solvent stripping methods and materials and dry oxygen plasma stripping methods and materials. Within the first preferred embodiment of the present invention, the pair of second patterned photoresist layers 26a and 26b, and the etched sacrificial via fill layer 24a, are preferably simultaneously stripped from the microelectronics fabrication whose schematic cross-sectional diagram is illustrated in FIG. 4 to provide in part the microelectronic fabrication whose schematic cross-sectional diagram is illustrated in FIG. 5.

Similarly, there is also shown in FIG. 5 the results of patterning the blanket diffusion barrier layer 12 to form a pair of patterned diffusion barrier layers 12a and 12b. Within the first preferred embodiment of the present invention, the blanket diffusion barrier layer 12 may be patterned to form the pair of patterned diffusion barrier layers 12a and 12b while employing methods as are convention in the art of microelectronic fabrication. Such methods may include, but are not limited to wet chemical etching methods employing aqueous phosphoric acid, as well as dry plasma etching methods employing plasmas analogous or equivalent to the first etching plasmas 22 or the second etching plasma 28.

Finally, there is shown within the schematic cross-sectional diagram of FIG. 5 formed into the reduced height via defined at least in part by the patterned first dielectric layers 14a and 14b and the contiguous trench defined at least in part by the twice etched patterned second dielectric layers 18a' and 18b' a contiguous patterned conductor stud layer/patterned conductor interconnect layer 30. Within the first preferred embodiment of the present invention, the contiguous patterned conductor stud layer/patterned conductor interconnect layer 30 may be formed employing methods and materials as are conventional in the art of microelectronic fabrication to form the contiguous patterned conductor stud layer/patterned conductor interconnect layer 30 of a conductor material including but not limited to a metal conductor material, a metal alloy conductor material, a polysilicon conductor material or a polycide (metal silicide/polysilicon stack) conductor material. Typically and preferably the contiguous patterned conductor stud layer/patterned conductor interconnect layer 30 is formed employing a chemical mechanical polish (CMP) planarizing of a blanket conductor layer formed upon the microelectronic fabrication whose schematic cross-sectional diagram is illustrated in FIG. 5 absent the contiguous patterned conductor stud layer/patterned conductor interconnect layer 30.

Upon forming the microelectronic fabrication whose schematic cross-sectional diagram is illustrated in FIG. 5, there is formed a microelectronic fabrication having formed therein a contiguous patterned conductor stud layer/patterned conductor interconnect layer with enhanced dimensional integrity insofar as there is employed when forming a via and contiguous trench within a dielectric layer within which is formed the contiguous patterned conductor stud layer/patterned conductor interconnect layer a sacrificial via fill layer within the via while etching the trench contiguous with the via.

Second Preferred Embodiment

Figure 6:
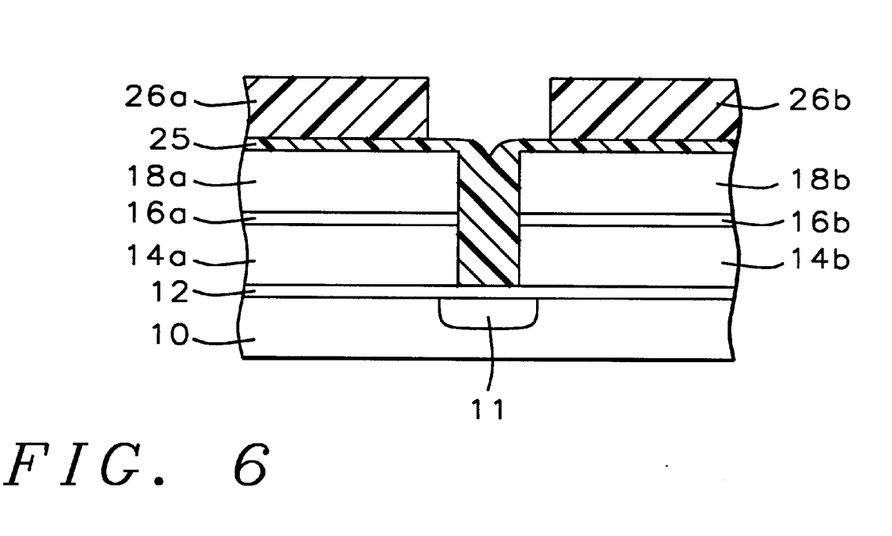
FIG. 6 and FIG. 7 show a pair of schematic cross-sectional diagrams illustrating the results of a pair of intermediate process steps for forming within a dielectric layer within a microelectronic fabrication in accord with a second preferred embodiment of the present invention a contiguous patterned conductor stud layer/patterned conductor interconnect layer within a corresponding via contiguous with a trench within the dielectric layer within the microelectronic fabrication.
Figure 7:
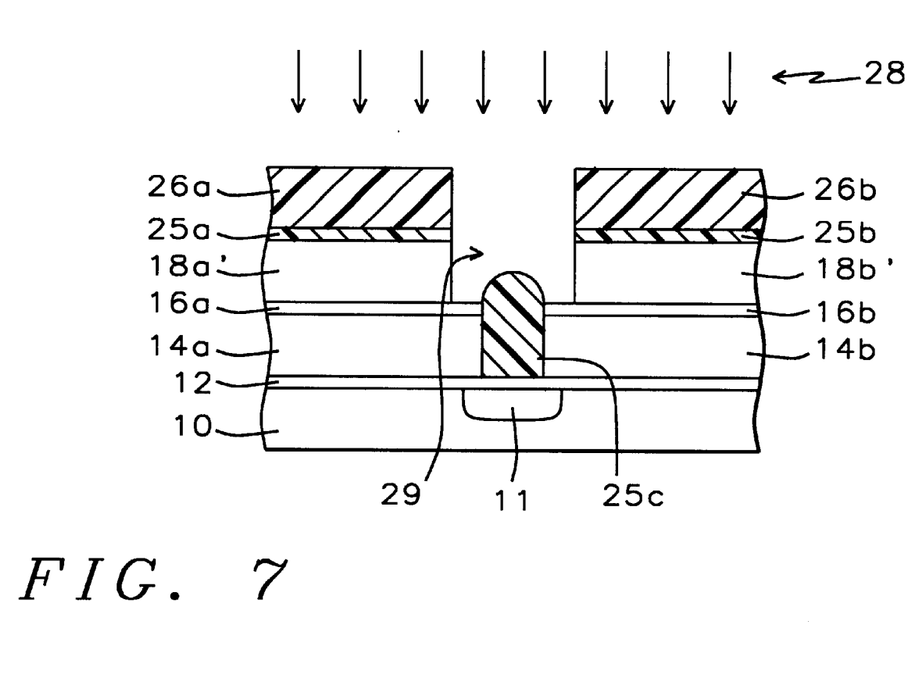

Referring now to FIG. 6 and FIG. 7, there is shown a pair of schematic cross-sectional diagrams illustrating the results of a pair of intermediate process steps for forming within a dielectric layer within a microelectronic fabrication in accord with a second preferred embodiment of the present invention a contiguous patterned conductor stud layer/patterned conductor interconnect layer within a corresponding via contiguous with a trench within the dielectric layer within the microelectronic fabrication. Shown in FIG. 6 is a schematic cross-sectional diagram of the microelectronic fabrication at an earlier stage in its fabrication in accord with the second preferred embodiment of the present invention.

Shown in FIG. 6 is a schematic cross-sectional diagram of a microelectronics fabrication otherwise equivalent to the microelectronic fabrication whose schematic cross-sectional diagram is illustrated in FIG. 3, and which may be formed, in part, employing methods and materials analogous or equivalent to the methods and materials employed for forming the microelectronic fabrications whose schematic cross-sectional diagrams are illustrated within FIG. 1 and FIG. 2, but wherein in the alternative of the sacrificial via fill layer 24 which is employed as a patterned planarized sacrificial vial fill layer 24 as illustrated within the schematic cross-sectional diagram of FIG. 3, there is instead formed interposed between the pair of second patterned photoresist layers 26a and 26b and the corresponding pair of patterned second dielectric layers 18a and 18b a blanket sacrificial via fill layer 25 which fills the via 23.

Within the second preferred embodiment of the present invention, the blanket second via fill layer 25 is, similarly with the patterned planarized sacrificial via fill layer 24 as illustrated within the schematic cross-sectional diagram of FIG. 3, also preferably formed of an organic polymer spin-on-polymer (SOP) material. However, it is also feasible and quite desirable within the second preferred embodiment of the present invention that the blanket sacrificial via fill layer 25 also serve as an anti-reflective coating (ARC) layer to attenuate reflections, primarily from the patterned second dielectric layers 18a and 18b, when photoexposing a corresponding blanket second photoresist layer in forming the pair of second patterned photoresist layers 26a and 26b. Preferably, the blanket sacrificial via fill layer 25 is formed to a thickness of from about 2000 to about 4000 angstroms interposed between the pair of second patterned photoresist layers 26a and 26b and the pair of patterned second dielectric layers 18a and 18b. A specific but by no means limiting example of a material from which may be formed the blanket sacrificial via fill layer 25 which simultaneously serves as a sacrificial via fill layer and an anti-reflective coating (ARC) layer is product designation DUV-42 anti-reflective coating (ARC) material available from Brewer Science, Inc., Rolla, Mo., USA.

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein the pair of second patterned dielectric layers 18a and 18b have been patterned to form the pair of twice patterned second dielectric layers 18a' and 18b' which define the trench 29 of areal dimension greater than the reduced height via having remaining therein an etched sacrificial via fill layer 25c. Similarly, there is also formed, as illustrated within the schematic cross-sectional diagram of FIG. 7, a pair of patterned sacrificial via fill and anti-reflective coating (ARC) layer residues 25a and 25b.

As is understood by a person skilled in the art, absent differences effected and incident to the substitution of the blanket sacrificial via fill layer 25 for the sacrificial via fill layer 24, the microelectronic fabrication whose schematic cross-sectional diagram is illustrated in FIG. 7 may be fabricated from the microelectronic fabrication whose schematic cross-sectional diagram is illustrated in FIG. 6 employing methods and materials analogous or equivalent to the methods and materials employed for fabricating the microelectronic fabrication whose schematic cross-sectional diagram is illustrated in FIG. 4 from the microelectronic fabrication whose schematic cross-sectional diagram is illustrated in FIG. 3.

The microelectronic fabrication whose schematic cross-sectional diagram is illustrated within FIG. 7 may then be further fabricated in accord with the microelectronic fabrication whose schematic cross-sectional diagram is illustrated in FIG. 4 to provide a microelectronic fabrication having formed therein a contiguous patterned conductor stud layer/patterned conductor interconnect layer formed within the reduced height via contiguous with the trench.

Similarly with the first preferred embodiment of the present invention, the contiguous patterned conductor stud layer/patterned conductor interconnect layer is formed with enhanced dimensional integrity due to the presence of a blanket sacrificial via fill layer formed within a via when etching a trench contiguous with the via, into which via and contiguous trench is formed the contiguous patterned conductor stud layer/patterned conductor interconnect layer.

As is understood by a person skilled in the art, the preferred embodiments of the present invention are illustrative of the present invention rather than limiting of the present invention. Revisions and modifications may be made to methods, materials, structures and dimensions through which is formed a via contiguous with a trench within a dielectric layer within a microelectronic fabrication in accord with the preferred embodiments of the present invention while still forming a via contiguous with a trench through a microelectronic layer within a microelectronic fabrication in accord with the present invention, as defined by the accompanying claims.

What is claimed is:

1. A method for forming through a microelectronic layer a via contiguous with a trench comprising:
   providing a substrate;
   forming over the substrate a first microelectronic layer;
   forming upon the first microelectronic layer an etch stop layer;
   forming upon the etch stop layer a second microelectronic layer;
   forming over the second microelectronic layer a first patterned mask layer which defines the location of a via to be formed through the second microelectronic layer, the etch stop layer and the first microelectronic layer;
   etching, while employing a first etch method which employs the first patterned mask layer as a first etch mask layer, the second microelectronic layer, the etch stop layer and the first microelectronic layer to form a corresponding patterned second microelectronic layer, patterned etch stop layer and patterned first microelectronic layer which define the via;
   removing the first patterned mask layer;
   then forming into at least a lower portion of the via defined by the patterned second microelectronic layer, the patterned etch stop layer and the patterned first microelectronic layer a sacrificial via fill layer;
   then forming over the patterned second microelectronic layer a patterned second mask layer which defines the location of a trench to be formed through the patterned second microelectronic layer, a first areal dimension of the via being smaller than and contained within a second areal dimension of the trench;
   then etching, while employing a second etch method which employs the second patterned mask layer as a second etch mask layer and the patterned etch stop layer as an etch stop layer, the patterned second microelectronic layer to form a twice patterned second microelectronic layer which defines the trench and a reduced height via, while not completely etching the sacrificial via fill layer within the reduced height via to form a no greater than partially etched sacrificial via fill layer within the reduced height via; and
   then stripping the no greater than partially etched sacrificial via fill layer from the reduced height via to form the reduced height via contiguous with the trench.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the first microelectronic layer, the etch stop layer, the second microelectronic layer and the sacrificial via fill layer are each individually formed of a microelectronic material selected from the group consisting of microelectronic conductor materials, microelectronic semiconductor materials and microelectronic dielectric materials.

4. The method of claim 1 wherein the first microelectronic layer and the second microelectronic layer are each formed to a thickness of from about 5000 to about 7000 angstroms.

5. The method of claim 1 further comprising forming within the reduced height via contiguous with the trench a contiguous patterned microelectronic stud layer/patterned microelectronic trench fill layer, wherein the contiguous patterned microelectronic stud layer/patterned microelectronic trench fill layer is formed of a microelectronic material selected from the group consisting of microelectronic conductor materials, microelectronic semiconductor materials and microelectronic dielectric materials.

6. The method of claim 1 wherein:
   the sacrificial via fill layer is also formed contiguously covering over the patterned second dielectric layer; and
   the sacrificial via fill layer also serves as an anti-reflective coating (ARC) layer when photoexposing a blanket photoresist layer from which is formed the second patterned mask layer.

7. The method of claim 6 wherein the sacrificial via fill layer is formed to a thickness of from about 2000 to about 4000 angstroms.

8. A method for forming through a microelectronic layer a via contiguous with a trench comprising:
   providing a substrate;
   forming over the substrate a first microelectronic dielectric layer;
   forming upon the first microelectronic dielectric layer an etch stop layer;
   forming upon the etch stop layer a second microelectronic dielectric layer;
   forming over the second microelectronic dielectric layer a first patterned mask layer which defines the location of a via to be formed through the second microelectronic dielectric layer, the etch stop layer and the first microelectronic dielectric layer;
   etching, while employing a first etch method which employs the first patterned mask layer as a first etch mask layer, the second microelectronic dielectric layer, the etch stop layer and the first microelectronic dielectric layer to form a corresponding patterned second microelectronic dielectric layer, patterned etch stop layer and patterned first microelectronic dielectric layer which define the via;
   removing the first patterned mask layer;
   then forming into at least a lower portion of the via defined by the patterned second microelectronic dielectric layer, the patterned etch stop layer and the patterned first microelectronic dielectric layer a sacrificial via fill layer;
   then forming over the patterned second microelectronic dielectric layer a patterned second mask layer which defines the location of a trench to be formed through the patterned second microelectronic dielectric layer, a first areal dimension of the via being smaller than and contained within a second areal dimension of the trench;
   then etching, while employing a second etch method which employs the second patterned mask layer as a second etch mask layer and the patterned etch stop layer as an etch stop layer, the patterned second microelectronic dielectric layer to form a twice patterned second microelectronic dielectric layer which defines the trench and a reduced height via, while not completely etching the sacrificial via fill layer within the reduced height via to form a no greater than partially etched sacrificial via fill layer within the reduced height via; and
   then stripping the no greater than partially etched sacrificial via fill layer from the reduced height via to form the reduced height via contiguous with the trench.

9. The method of claim 8 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

10. The method of claim 8 wherein each of the first microelectronic dielectric layer and the second microelectronic dielectric layer is formed to a thickness of from about 5000 to about 7000 angstroms.

11. The method of claim 8 wherein the sacrificial via fill layer is formed of a spin-on-polymer (SOP) material.

12. The method of claim 8 further comprising forming within the reduced height via contiguous with the trench a contiguous patterned conductor stud layer/patterned conductor interconnect layer.

13. The method of claim 8 wherein:
   the sacrificial via fill layer is also formed contiguously covering over the patterned second microelectronic dielectric layer; and
   the sacrificial via fill layer also serves as an anti-reflective coating (ARC) layer when photoexposing a blanket photoresist layer from which is formed the patterned second mask layer.

14. The method of claim 13 wherein the sacrificial via fill layer is formed to a thickness of from about 2000 to about 4000 angstroms.

15. The method of claim 1, including the step of forming a blanket diffusion barrier layer over the substrate before formation of the first microelectronic layer.

16. The method of claim 1, including the step of forming a blanket diffusion barrier layer over the substrate before formation of the first microelectronic layer; the blanket diffusion barrier layer having a thickness of from about 200 to 400 Å.

17. The method of claim 1, including the step of forming a blanket diffusion silicon nitride dielectric material barrier layer over the substrate before formation of the first microelectronic layer; the blanket diffusion silicon nitride dielectric material barrier layer having a thickness of from about 200 to 400 Å.

18. The method of claim 1, wherein the substrate includes a contact region, the contact region being exposed by the via formed by the first etch method.

19. The method of claim 1, wherein the substrate includes a contact region having a bidirectional linewidth from about 0.2 to 0.4 microns, the contact region being exposed by the via formed by the first etch method.

20. The method of claim 1, wherein the substrate includes a copper containing conductor contact region, the contact region being exposed by the via formed by the first etch method.

21. The method of claim 1, wherein the etch stop layer is from about 300 to 600 Å, and is comprised of a material selected from the group comprising a dense silicon nitride dielectric material and a dense silicon oxynitride dielectric material.

22. The method of claim 1, wherein the first etch method employs a reactor chamber pressure of from about 100 to about 300 mTorr; a radio frequency source power of from about 800 to about 1200 watts at a source radio frequency of 13.56 MHz; a bias power of from about 30 to about 70 watts; a substrate temperature of from about 20 to about 50 degrees centigrade; a carbon tetrafluoride flow rate of from about 7 to about 13 sccm; a trifluoromethane flow rate of from about 40 to about 60 sccm; and an argon flow rate of from about 100 to about 140 sccm.

23. The method of claim 8, including the step of forming a blanket diffusion barrier layer over the substrate before formation of the first microelectronic dielectric layer.

24. The method of claim 8, including the step of forming a blanket diffusion barrier layer over the substrate before formation of the first microelectronic dielectric layer; the blanket diffusion barrier layer having a thickness of from about 200 to 400 Å.

25. The method of claim 8, including the step of forming a blanket diffusion silicon nitride dielectric material barrier layer over the substrate before formation of the first microelectronic dielectric layer; the blanket diffusion silicon nitride dielectric material barrier layer having a thickness of from about 200 to 400 Å.

26. The method of claim 8, wherein the substrate includes a contact region, the contact region being exposed by the via formed by the first etch method.

27. The method of claim 8, wherein the substrate includes a contact region having a bidirectional linewidth from about 0.2 to 0.4 microns, the contact region being exposed by the via formed by the first etch method.

28. The method of claim 8, wherein the substrate includes a copper containing conductor contact region, the contact region being exposed by the via formed by the first etch method.

29. The method of claim 8, wherein the etch stop layer is from about 300 to 600 Å, and is comprised of a material selected from the group comprising a dense silicon nitride dielectric material and a dense silicon oxynitride dielectric material.

30. The method of claim 8, wherein the first etch method employs a reactor chamber pressure of from about 100 to about 300 mTorr; a radio frequency source power of from about 800 to about 1200 watts at a source radio frequency of 13.56 MHz; a bias power of from about 30 to about 70 watts; a substrate temperature of from about 20 to about 50 degrees centigrade; a carbon tetrafluoride flow rate of from about 7 to about 13 sccm; a trifluoromethane flow rate of from about 40 to about 60 sccm; and an argon flow rate of from about 100 to about 140 sccm.

31. A method for forming through a microelectronic layer a via contiguous with a trench comprising:

providing a substrate;

forming over the substrate a first microelectronic layer;

forming upon the first microelectronic layer an etch stop layer; the etch stop layer having a thickness of from about 300 to 600 Å and being comprised of a material selected from the group comprising a dense silicon nitride dielectric material and a dense silicon oxynitride dielectric material;

forming upon the etch stop layer a second microelectronic layer;

forming over the second microelectronic layer a first patterned mask layer which defines the location of a via to be formed through the second microelectronic layer, the etch stop layer and the first microelectronic layer;

etching, while employing a first etch method which employs the first patterned mask layer as a first etch mask layer, the second microelectronic layer, the etch stop layer and the first microelectronic layer to form a corresponding patterned second microelectronic layer, patterned etch stop layer and patterned first microelectronic layer which define the via;

removing the first patterned mask layer;

then forming into at least a lower portion of the via defined by the patterned second microelectronic layer, the patterned etch stop layer and the patterned first microelectronic layer a sacrificial via fill layer;

then forming over the patterned second microelectronic layer a patterned second mask layer which defines the location of a trench to be formed through the patterned second microelectronic layer, a first areal dimension of the via being smaller than and contained within a second areal dimension of the trench;

then etching, while employing a second etch method which employs the second patterned mask layer as a second etch mask layer and the patterned etch stop layer as an etch stop layer, the patterned second microelectronic layer to form a twice patterned second microelectronic layer which defines the trench and a reduced height via, while not completely etching the sacrificial via fill layer within the reduced height via to form a no greater than partially etched sacrificial via fill layer within the reduced height via; and then stripping the no greater than partially etched sacrificial via fill layer from the reduced height via to form the reduced height via contiguous with the trench.

32. The method of claim 31, including the step of forming a blanket diffusion barrier layer over the substrate before formation of the first microelectronic layer.

33. The method of claim 31, including the step of forming a blanket diffusion barrier layer over the substrate before formation of the first microelectronic layer; the blanket diffusion barrier layer having a thickness of from about 200 to 400 Å.

34. The method of claim 31, including the step of forming a blanket diffusion silicon nitride dielectric material barrier layer over the substrate before formation of the first microelectronic layer; the blanket diffusion silicon nitride dielectric material barrier layer having a thickness of from about 200 to 400 Å.

35. The method of claim 31, wherein the substrate includes a contact region, the contact region being exposed by the via formed by the first etch method.

36. The method of claim 31, wherein the substrate includes a contact region having a bidirectional linewidth from about 0.2 to 0.4 microns, the contact region being exposed by the via formed by the first etch method.

37. The method of claim 31, wherein the substrate includes a copper containing conductor contact region, the contact region being exposed by the via formed by the first etch method.

38. The method of claim 31, wherein the first etch method employs a reactor chamber pressure of from about 100 to about 300 mTorr; a radio frequency source power of from about 800 to about 1200 watts at a source radio frequency of 13.56 MHz; a bias power of from about 30 to about 70 watts; a substrate temperature of from about 20 to about 50 degrees centigrade; a carbon tetrafluoride flow rate of from about 7 to about 13 sccm; a trifluoromethane flow rate of from about 40 to about 60 sccm; and an argon flow rate of from about 100 to about 140 sccm.

* * * * *